United States Patent [19]

Bosselmann et al.

[11] Patent Number: 6,114,846
[45] Date of Patent: Sep. 5, 2000

[54] OPTICAL MEASURING METHOD AND DEVICE FOR MEASURING A MAGNETIC ALTERNATING FIELD WITH AN EXPANDED MEASURING RANGE AND GOOD LINEARITY

[75] Inventors: Thomas Bosselmann, Erlangen; Peter Menke, Bötzow, both of Germany

[73] Assignee: Siemens Aktiengesellschaft, Munich, Germany

[21] Appl. No.: 09/117,006

[22] PCT Filed: Jan. 3, 1997

[86] PCT No.: PCT/EP97/00022

§ 371 Date: Jan. 8, 1999

§ 102(e) Date: Jan. 8, 1999

[87] PCT Pub. No.: WO97/26547

PCT Pub. Date: Jul. 24, 1997

[30] Foreign Application Priority Data

Jan. 18, 1996 [DE] Germany ............... 196 01 727

[51] Int. Cl.[7] .............. G01R 33/032; G01R 15/24; G01R 19/02
[52] U.S. Cl. ............................ 324/96; 324/244.1
[58] Field of Search ................... 324/96, 244.1; 356/364; 250/227.17

[56] References Cited

U.S. PATENT DOCUMENTS

| | | |
|---|---|---|
| 4,755,665 | 7/1988 | Ulmer, Jr. et al. . |
| 4,894,608 | 1/1990 | Ulmer, Jr. .................. 324/96 |
| 4,973,899 | 11/1990 | Jones et al. ................. 324/96 |
| 5,656,934 | 8/1997 | Bosselmann ........... 324/244.1 X |
| 5,764,046 | 6/1998 | Bosselmann ................. 324/96 |
| 5,844,409 | 12/1998 | Bosselmann et al. ............ 324/96 |
| 5,847,560 | 12/1998 | Bosselmann et al. ............ 324/96 |

FOREIGN PATENT DOCUMENTS

| | | |
|---|---|---|
| 0 088 419 | 9/1983 | European Pat. Off. . |
| 0 208 593 | 1/1987 | European Pat. Off. . |
| 89/00701 | 1/1989 | WIPO . |
| 91/01500 | 2/1991 | WIPO . |
| 95/10046 | 4/1995 | WIPO . |

OTHER PUBLICATIONS

Hirsch et al. "Fiber Optic Current Sensor With Optical Analog Transmission" Sensor 93 Conference Report IV vol. 11.1, pp. 137–144 *Jan. 1993.

*Primary Examiner*—Gerard Strecker
*Attorney, Agent, or Firm*—Kenyon & Kenyon

[57] ABSTRACT

Linearly polarized measuring light is split after traversing a Faraday sensor device into two partial light signals having planes of polarization inclined at 45°. A measured signal, which is proportional to the tangent of the Faraday rotation angle, is derived from the two partial light signals.

6 Claims, 2 Drawing Sheets

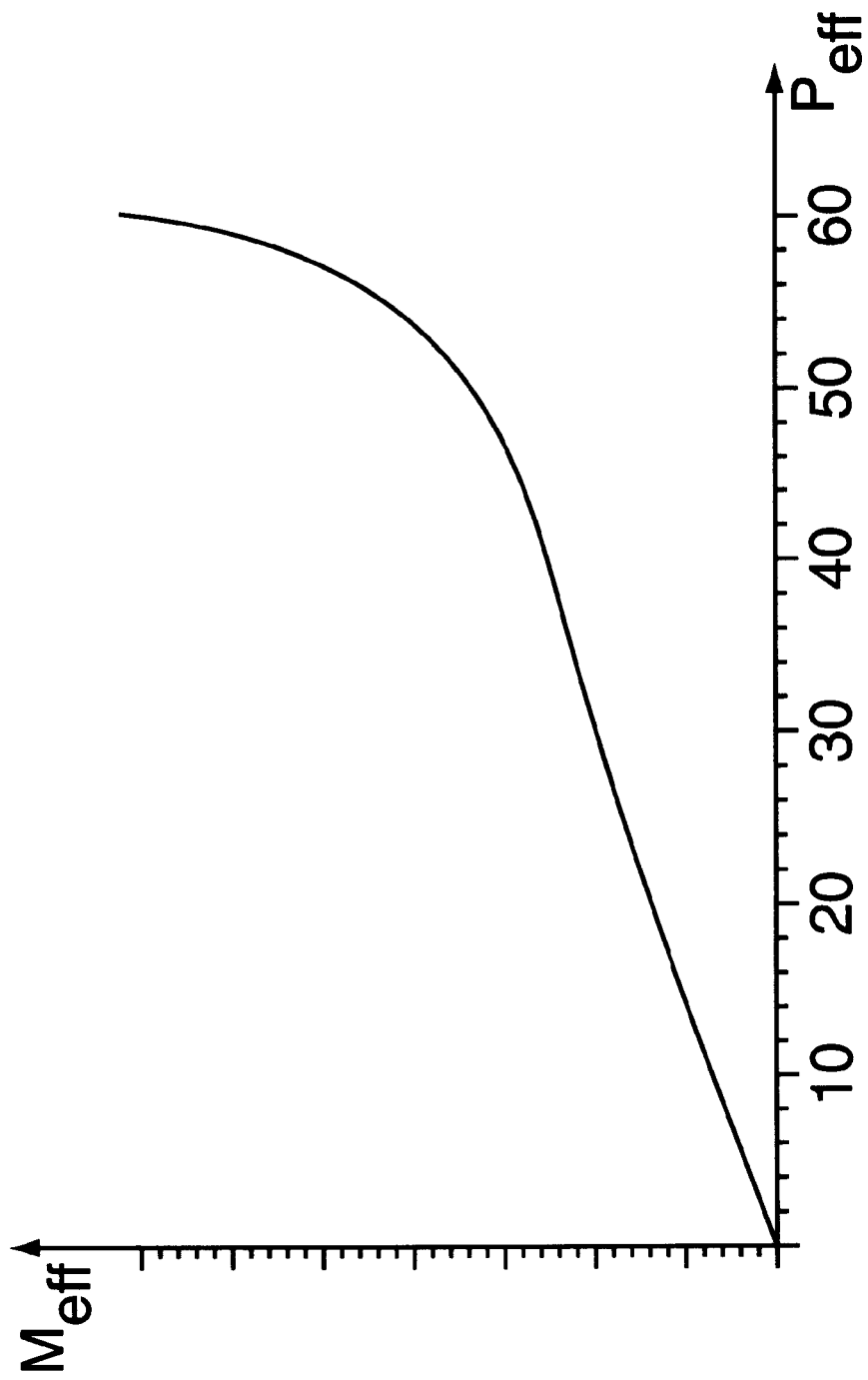

OPTICAL MEASURING METHOD AND DEVICE FOR MEASURING A MAGNETIC ALTERNATING FIELD WITH AN EXPANDED MEASURING RANGE AND GOOD LINEARITY

FIELD OF THE INVENTION

The present invention relates to a method and an arrangement for measuring an alternating magnetic field. An alternating magnetic field is understood to be a magnetic field which has in its frequency spectrum only frequency components differing from zero.

BACKGROUND OF THE INVENTION

Optical measuring arrangements for measuring an electrical current in an electrical conductor are known which are based on the magneto-optic Faraday effect, and are therefore also designated as magneto-optic current transformers. In a magneto-optic current transformer, linearly polarized measuring light is transmitted through a Faraday sensor device which is arranged in the vicinity of the electrical conductor and includes an optically transparent material exhibiting the Faraday effect. Because of the Faraday effect, the magnetic field generated by the current causes a rotation of the plane of polarization of the measuring light by a rotational angle ρ, which is proportional to the path integral over the magnetic field along the path covered by the measuring light in the sensor device. The constant of proportionality is the Verdet constant V. The Verdet constant V is generally a function of the material and the temperature of the sensor device, as well as of the wavelength of the measuring light employed. In general, the sensor device surrounds the electrical conductor, so that the measuring light runs at least once around the electrical conductor in a virtually closed path. The rotational angle ρ is, in this case, essentially directly proportional to the amplitude I of the current to be measured, in accordance with the relation $$\rho = N \cdot V \cdot I \quad (1),$$

N being the number of revolutions of the measuring light around the electrical conductor. The Faraday rotational angle ρ is determined polarimetrically by performing a polarization analysis of the measuring light running through the sensor device, in order to obtain a measuring signal for the electrical current.

It is known for the purpose of polarization analysis to use an analyzer to decompose the measuring light, after it has traversed the sensor device, into two linearly polarized light components L1 and L2 having planes of polarization, which are directed perpendicularly with respect to one another. A polarizing beam splitter can be used as the analyzer for this polarization analysis. Specifically, some of the types of polarizing beam splitters that can be used in this analysis include a Wollaston prism or a simple beam splitter having two downstream polarizers whose axes of polarization are rotated by π/2 or 90° with respect to one another. Each of the two light components L1 and L2 is converted by one assigned photoelectric transducer into, in each case, an electrical intensity signal T1 or T2, which is proportional to the light intensity of the light component L1 or L2, respectively. A measuring signal $$T = (T1 - T2)/(T1 + T2) \quad (3)$$

which corresponds to the quotient of a difference and the sum of the two intensity signals T1 and T2, as described in PCT Application No. WO 95/10046, is formed from these two electrical signals.

Disregarding interference effects, this measuring signal T is given by $$T = \sin(2\pi + \zeta) = \sin(2 \cdot N \cdot V \cdot I + \zeta) \quad (4),$$

ζ being an offset angle for I=0 A, which is a function of the angle between the plane of polarization of the measuring light on being coupled into the Faraday element and a distinctive intrinsic optical axis of the analyzer.

Although, according to equation (1), the Faraday measuring angle ρ is itself a linear, and thus unique, function of the current I, according to equation (4) the measuring signal T is a unique function of the measuring angle ρ only over an angular range of at most π/2 (or 90°). Consequently, it is possible using these polarimetric magneto-optic current transformers to measure uniquely only those electrical currents which lie in a current measuring range (current measuring interval) MR with an interval length of $$|MR| = \pi/(2 \cdot N \cdot V) \quad (5)$$

It is clear from equation (5) that the magnitude |MR| of the current measuring range MR of a magneto-optic current transformer can be set by the selection of materials having different Verdet constants V for the Faraday element and/or by the number N of revolutions of the measuring light around the electrical conductor. A larger current measuring range is obtained by setting the product N·V in the denominator smaller. However, such a selection of a larger current measuring range MR is inescapably attended by a reduced measuring resolution MA of the current transformer for a given display resolution. The measuring resolution MA is defined in this case as the absolute value |MS| of the measuring sensitivity MS of the current transformer. The measuring sensitivity MS corresponds to the gradient of the characteristic curve of the magneto-optic current transformer at an operating point, and in the case of two-channel evaluation, is given according to equation (4) by $$MS = dT/dI = 2 \cdot N \cdot V \cdot \cos(2 \cdot N \cdot V \cdot I + \zeta) \quad (6).$$

It is immediately evident from equation (6) that reducing the product N·V leads, in the case of both evaluation methods, to a reduction in the measuring resolution MA=|MS|.

European Patent Application No. 088 419 describes a magneto-optic current transformer in which two Faraday glass rings, which are made of Faraday materials having different Verdet constants and thus each having inherently different current measuring ranges, are arranged parallel to one another about a common electrical conductor. Each Faraday glass ring is assigned a transmission unit for transmitting linearly polarized measuring light into the glass ring and a two-channel evaluation unit for calculating a respective measuring signal for each Faraday rotational angle. The two measuring signals of the two evaluation units are fed to an OR gate, which determines a maximum signal from the two measuring signals. This maximum signal is used to switch between the measuring ranges of the two glass rings. Different measuring ranges of the two glass rings can also be obtained given the same glass material for the two glass rings by employing measuring light of different wavelengths. In this context, the wavelength dependence of the Faraday rotation is utilized.

The publication entitled "Fiber Optic Current Sensor With Optical Analog Transmission", SENSOR 93 Conference Report IV Vol. 11.1, pages 137 to 144, describes a magneto-optical current transformer for protective purposes for measuring alternating currents, in which, after traversing a Faraday optical fiber, linearly polarized light is split into two partial light signals and each of these light signals is fed to an analyzer. The intrinsic axes (axes of polarisation) of the two analyzers are directed at an angle of 45° or 58° is relative to one another. The light intensities passed by the analyzers are not normalized until division by their constant components, which are obtained by peak value rectification. Subsequently, a product of the normalized signals is formed and this product is then differentiated. The Faraday rotational angle is obtained directly by integration. As a result, a signal is obtained which is proportional to the current and, therefore, is not subject to measuring range limitations. However, this method is comparatively costly.

European Patent No. 208 593 describes a magneto-optic current transformer in which, after traversing a Faraday optical fiber surrounding an electrical conductor, linearly polarized measuring light is split by a beam splitter into two partial light signals and each of these partial light signals is fed to an analyzer. The intrinsic axes of the two analyzers are directed at an angle of 0° and 45°, respectively, relative to the coupling polarization of the measuring light. This produces a first, sinusoidal signal at the output of one analyzer, and a second, cosinusoidal signal at the output of the other analyzer. These two signals are, in each case, non-unique, oscillating functions of the current in the electrical conductor, which are phase-shifted with respect to one another by an angle of 90°. A unique measuring signal is now composed from these two non-unique signals by comparing the sign and the absolute values of the measuring values of the first, sinusoidal signal and of the second, cosinusoidal signal. As soon as the absolute values of the sine and cosine are equal, that is to say given an integral multiple of 45°, a switch is made, as a function of the sign of sine and cosine, from a unique branch of the first, sinusoidal signal to a unique branch of the second, cosinusoidal signal, or vice versa. The measuring range of this known magneto-optic current transformer is thus, in principle, unlimited. However, the method is an incremental method, with the result that the operating point for current zero must be reset anew whenever there is a failure of the electronics of the current transformer.

SUMMARY OF THE INVENTION

An object of the present invention is to specify a method and an arrangement, having an extended measuring range and good linearity, for measuring an alternating magnetic field.

In order to achieve this object, linearly polarized measuring light is coupled into a sensor device which exhibits the Faraday effect and is arranged in the alternating magnetic field, at least during the measuring operation. The measuring light traverses the sensor device at least once and is thereafter fed into two linearly polarized partial light signals whose directions of polarization are directed, relative to one another, at an angle of essentially an odd multiple of 45° or $\pi/4$. The two partial light signals are, in each case, converted into an electrical intensity signal which is a measure of the light intensity of the associated partial light signal. An alternating signal component and a constant signal component are determined from a first of the two electrical intensity signals, and a constant signal component is determined from a second of the two intensity signals. The alternating signal component contains essentially all the frequency components of the alternating magnetic field. The two constant signal components, in contrast, contain essentially no frequency components of the alternating magnetic field.

A measuring signal is now derived for the alternating magnetic field and is proportional to a quotient of two intensity-normalized signals, a first of the two intensity-normalized signals corresponding to the quotient of the alternating signal component and the constant signal component of the first intensity signal, and a second of the two intensity-normalized signals corresponding to the quotient of the second intensity signal and the constant signal component thereof. This measuring signal is, on the one hand, virtually independent of undesirable intensity fluctuations of the measuring light and is, on the other hand, a unique function over an angular range of approximately $\pi$ for the Faraday rotational angle $\rho$, by which the plane of polarization of the measuring light in the sensor device is rotated based on the magnetic field, for example over the open angular range of $T/2 < \rho < +\pi 2$. Furthermore, the measuring signal has an excellent linearity in a large range, around an operating point situated in the middle of the measuring range.

According to the present invention, as a measure of the root-mean-square value of the alternating magnetic field, a root-mean-square value is formed from the measuring signal, for the purpose of precision measurement.

In order to measure an alternating electrical field, the sensor device is arranged in the alternating magnetic field generated inductively by the alternating current.

BRIEF DESCRIPTION OF THE DRAWINGS

FIG. 2 illustrates the root-mean-square value of the measured current as a function of the Faraday measuring angle.

DETAILED DESCRIPTION

Figure 1:
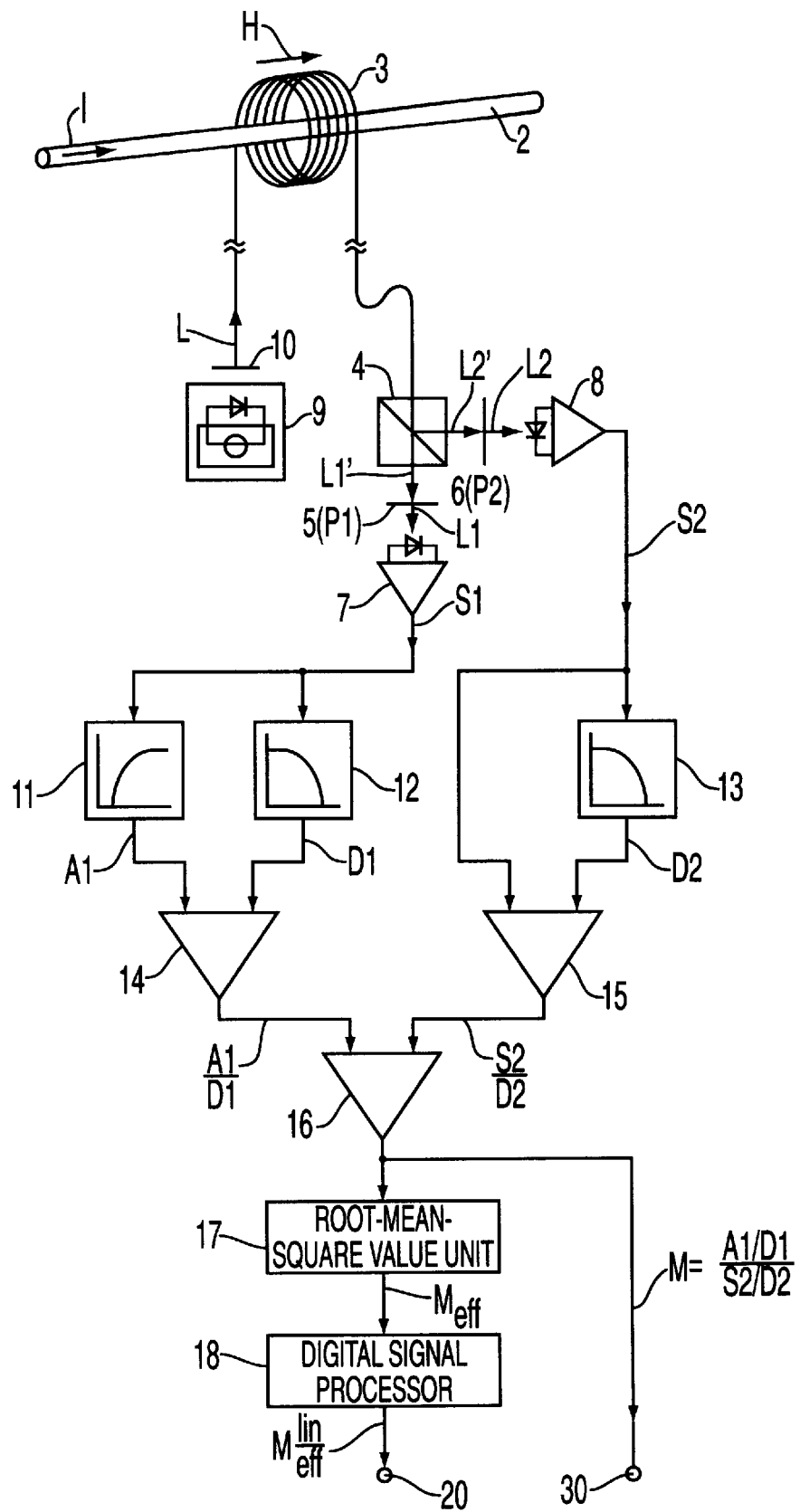
FIG. 1 is a schematic of an arrangement for measuring an alternating magnetic field and, in particular, for measuring an alternating electrical current in accordance with an exemplary embodiment of the invention.

Represented in FIG. 1 is an exemplary embodiment of an arrangement for measuring an alternating magnetic field H which can be generated, in particular, by an electrical current I in an electrical conductor 2. A sensor device 3 exhibiting the magneto-optic Faraday effect is arranged in alternating magnetic field H. In the embodiment represented, sensor device 3 is formed by means of a single-mode optical fiber which preferably surrounds electrical conductor 2 in the form of a measuring winding of at least one turn. It is preferred to provide an annealed optical fiber which is distinguished by low linear birefringence and virtually negligible circular birefringence. However, sensor device 3 can also be formed from one or more solid bodies, preferably made from glass, exhibiting the Faraday effect, and can, in particular, surround electrical conductor 2 as a polygonal annular body. Means are provided for coupling linearly polarized measuring light L into sensor device 3. The direction of polarization of the electrical field strength vector of measuring light L during coupling into sensor device 3 is denoted below as the direction of coupling polarization of measuring light L. The means for coupling measuring light L into sensor device 3 can, as represented, contain a light source 9 and a polarizer 10 for linearly polarizing the light of light source 9, or also a light source which is itself linearly polarized, such as a laser diode, for example. In the embodiment represented, the axis of polarization (transmission axis) of polarizer 10 prescribes the direction of coupling polarization of measuring light L. The linearly polarized measuring light L coupled into sensor device 3 traverses sensor device 3 and is fed, after traversing sensor device 3, to a beam splitter 4. Beam splitter 4 decomposes measuring light L into two light components L1' and L2' having the same polarization. For example, beam splitter 4 can be formed with a semi-transparent mirror inclined at an angle of preferably 45° to the direction of propagation of measuring light L. A first polarizer 5, which forms a first partial light signal L1 projected onto its axis P1 of polarization, is arranged in the optical path (beam path) of first light component L1'. A second polarizer 6, which forms a second partial light signal L2 projected onto its associated axis P2 of polarization, is arranged in the optical path of second light component L2'. Axis P1 of polarization of first polarizer 5 and axis P2 of polarization of second polarizer 6 form an angle of at least approximately $$\alpha = (2n+1) \cdot 45° \text{ or}$$

$$\alpha = (2n+1) \cdot (\pi/4) \tag{7}$$

relative to one another, where n is a whole number. Axis P1 of polarization of first polarizer 5 is preferably directed at an angle of at least approximately +45° or +π/4, or −45° or −π/4 relative to the direction of coupling polarization of measuring light L, and axis P2 of polarization of second polarizer 6 is directed at an angle of 0° or 0 relative to the direction of coupling polarization of measuring light L.

The two component signals L1 and L2 are fed to an assigned photoelectric transducer 7 or 8, respectively. Each photoelectric transducer 7 and 8 converts associated light signals L1 and L2, respectively, into an electrical intensity signal S1 or S2, respectively, which is a measure of the intensity of the respective partial light signal L1 or L2. Generally, electrical intensity signal S1 or S2 is proportional to the light intensity of associated partial light signal L1 or L2, respectively. The output of first photoelectric transducer 7 is then electrically connected to the input on a high-pass filter 11 and to the input of a low-pass filter 12. High-pass filter 11 forms an alternating signal component A1 of first intensity signal S1, and low-pass filter 12 forms a constant signal component D1 of this first intensity signal S1. The separating frequency of high-pass filter 11 and low-pass filter 12 are set such that alternating signal component A1 contains all the frequency components of alternating magnetic field H, and constant signal component D1 is independent of alternating magnetic field H. Alternating signal component A1 of first intensity signal S1 is fed from an output of high-pass filter 11 to a first input of a divider 14. Constant signal component D1 of first intensity signal S1 is fed from an output of low-pass filter 12 to a second input of divider 14.

Divider 14 now forms quotient signal A1/D1 of alternating signal component A1 to constant signal component D1 of first intensity signal S1. This quotient signal A1/D1 is an intensity-normalized signal, that is to say it is independent of changes in the intensity of measuring light L, for example, owing to intensity fluctuations of light source 9 or attenuation losses in the light path of measuring light L or of first partial light signal L1. The output of second photoelectric transducer 8 is electrically connected to the input of a low-pass filter 13 and to a first input of a divider 15. Lowpass filter 13 forms a constant signal component D2 of second intensity signal S2. The separating frequency of lowpass filter 13 is set such that constant signal component D2 contains no frequency components of alternating magnetic field H. There is now present at an output of divider 15 a quotient signal S2/D2 which corresponds to the quotient of second intensity signal S2 and constant signal component D2 thereof. This quotient signal S2/D2 is also an intensity-normalized signal, and is thus independent of changes in intensity in measuring light L and in second partial light signal L2. Since changes in intensity in the light paths of two partial light signals L1 and L2 are compensated by the intensity normalization, multimode fibers can also be used to transmit two partial light signals L1 and L2. Two normalized signals A1/D1 and S2/D2 are now fed, in each case, to an input of a further divider 16. Divider 16 forms the quotient of two normalized signals A1/D1 and S2/D2 as measuring signal $$M = (A1/D1)/(S2/D2) \tag{8}$$

which can be tapped at an output 30 of the arrangement.

This measuring signal M is similar to function tan(ρ) of Faraday rotation angle ρ by which the direction of polarization (plane of polarization) of measuring light (L) is rotated in sensor device 3 based on alternating magnetic field H. However, tangent function tan(ρ) is a unique function of rotational angle ρ over an angular interval having an interval length of approximately π, specifically for −π/2+2mπ<ρ<+π/2 +2mπ, with m being a whole number. The result is a measuring range which is virtually twice as large as in the case of the measuring signals obtained in accordance with the related art, which are proportional to sin(2ρ).

In a preferred embodiment, means 17 are provided for forming root-mean-square value $M_{eff}$ of measuring signal M, which functions as a measure of the amplitude (absolute value) of alternating magnetic field H, or as a measure of root-mean-square value $I_{eff}$ of an electrical current I in electrical conductor 2. FIG. 2 shows root-mean-square value $M_{eff}$ of measuring signal M for a sinusoidal electrical current $I = 2^{0.5} I_{eff} \sin(\omega t)$, plotted over an angular range of 0° to approximately 60° of root-mean-square value $\rho_{eff}$ of Faraday rotational angle $\rho = 2^{0.5} \rho_{eff} \sin(\omega t)$. Root-mean-square value $I_{eff}$ of electrical current I is then obtained from equation $\rho_{eff} = 2$ NV $I_{eff}$ with N the number of turns of the fiber coil (measuring winding) and Verdet constant V of sensor device 3. Any analog or digital circuit known per se can be used to form root-mean-square value $M_{eff}$.

Root-mean-square value $M_{eff}$ of measuring signal M can also be subjected to a subsequent linearization, preferably with the aid of a digital signal processor 18. Linearized root-mean-square value $M_{eff}^{lin}$, then linearly dependent on rotational angle ρ, is applied to an output 20. Of course, root-means-quare value $M_{eff}$ itself can also be applied to an output (not represented).

Instead of high-pass filter 11, it is also possible, for the purpose of forming alternating signal component A1 of first intensity signal S1, to provide a subtractor which forms difference S1−D1 between first intensity signal S1 and its constant signal component D1, which is formed by lowpass filter 12. This difference corresponds precisely to constant signal component A1. Conversely, instead of low-pass filter 12, it is also possible, for the purpose of forming constant signal component D1 of first intensity signal Si, to provide a subtractor which forms difference S1−A1 between first intensity signal S1 and its alternating signal component A1, which is formed by high-pass filter 11. This difference corresponds precisely to constant signal component D1. Furthermore, low-pass filter 13 can also be replaced by a high-pass filter for the purpose of forming an alternating signal component A2 of second intensity signal S2, and by a subtractor for the purpose of forming constant signal component D2 of second intensity signal S2 by subtracting alternating signal component A2 from second intensity signal S2. Finally, the analog filters represented can also be replaced by digital filters and analog-to-digital convertors connected upstream.

Of course, instead of analog dividers 14, 15 and 16, it is also possible to provide digital calculating means as arithmetic means for deriving measuring signal M, in accordance with relation (8). As explained above, the value of relation (8) is based on alternating signal component A1 and constant signal component D1 of first intensity signal S1 and from second intensity signal S2 and a constant signal component D2 thereof. Such a digital calculating means may include a microprocessor or a digital signal processor having an analog-to-digital converter connected upstream. It is preferable to provide both digital filters and digital arithmetic means. The analog-to-digital conversion is then performed upstream of the digital filters.

The optical coupling of the various optical components of the measuring arrangement is preferably supported by collimator lenses (Grin lenses), not depicted, for focusing the light.

Instead of the type of transmission shown in FIG. 1, in which measuring light L traverses sensor device 3 only once, it is also possible to provide an arrangement of the reflection type in which, after traversing sensor device 3 a first time, measuring light L is retroflected into sensor device 3 with the aid of a mirror and traverses sensor device 3 a second time in the opposite direction, before it is fed to beam splitter 4.

What is claimed is:

1. A method for measuring an alternating magnetic field, comprising the steps of:
    a) coupling a linearly polarized measuring light into a sensor device, the sensor device being arranged in the alternating magnetic field and exhibiting the Faraday effect;
    b) causing the linearly polarized measuring light to traverse the sensor device at least once;
    c) splitting the linearly polarized measuring light into a first linearly polarized partial light signal and a second linearly polarized partial light signal, wherein a direction of polarization of the first linearly polarized partial light signal and a direction of polarization of the second linearly polarized partial light signal are at an angle relative to one another, the angle being substantially an odd multiple of 45°;
    d) converting the first linearly polarized partial light signal into a first electrical intensity signal, the first electrical intensity signal being a measure of a light intensity of the first linearly polarized partial light signal;
    e) converting the second linearly polarized partial light signal into a second electrical intensity signal, the second electrical intensity signal being a measure of a light intensity of the second linearly polarized partial light signal;
    f) determining a first alternating signal component and a first constant signal component from the first electrical intensity signal, the first alternating signal component including substantially all frequency components of the alternating magnetic field;
    g) determining a second constant signal component from the second electrical intensity signal, wherein the first constant signal component and the second constant signal component includes substantially none of the frequency components of the alternating magnetic field;
    h) deriving a first intensity-normalized signal from a quotient of the first alternating signal component and the first constant signal component;
    i) deriving a second intensity-normalized signal from a quotient of the second electrical intensity signal and the second constant signal component; and
    j) deriving a measuring signal for the alternating magnetic field, the measuring signal being proportional to a quotient of the first intensity-normalized signal and the second intensity-normalized signal.

2. The method according to claim 1, further comprising the step of:
    forming from the measuring signal a measure of a root-mean-square value of the alternating magnetic field.

3. The method according to claim 1, wherein the alternating magnetic field is generated by an alternating electrical field, and wherein the method further comprises the step of measuring the alternating electrical field.

4. A system for measuring an alternating magnetic field, comprising:
    a) a sensor device capable of exhibiting the Faraday effect;
    b) an arrangement for coupling a linearly polarized measuring light into the sensor device;
    c) an arrangement for splitting the linearly polarized measuring light, after the linearly polarized measuring light has traversed the sensor device at least once, into a first linearly polarized partial light signal and a second linearly polarized partial light signal, a direction of polarization of the first linearly polarized partial light signal and a direction of polarization of the second linearly polarized partial light signal are at an angle relative to one another, the angle being substantially an odd multiple of 45°;
    d) an arrangement for converting the first linearly polarized partial light signal into a first electrical intensity signal, the first electrical intensity signal being a measure of a light intensity of the first linearly polarized partial light signal, the arrangement for converting further for converting the second linearly polarized partial light signal into a second electrical intensity signal, the second electrical intensity signal being a measure of a light intensity of the second linearly polarized partial light signal;
    e) an arrangement for determining a first alternating signal component and a first constant signal component from the first electrical intensity signal, the first alternating signal component essentially including all frequency components of the alternating magnetic field, the arrangement for determining further for determining a second constant signal component from the second electrical intensity signal, wherein none of the first constant signal component and the second constant signal component includes the frequency components of the alternating magnetic field; and
    f) an arrangement for deriving a first intensity-normalized signal from a quotient of the first alternating signal component and the first constant signal component, for deriving a second intensity-normalized signal from a quotient of the second electrical intensity signal and the second constant signal component, and for deriving a measuring signal for the alternating magnetic field, the measuring signal being proportional to a quotient of the first intensity-normalized signal and the second intensity-normalized signal.

5. The system according to claim 4, further comprising an arrangement for forming from the measuring signal a measure of a root-mean-square value of the alternating magnetic field.

6. The system according to claim 4, wherein the alternating magnetic field is generated by an alternating electrical field, and wherein the system further comprises an arrangement for measuring the alternating electrical field.

* * * * *